Figure 1:
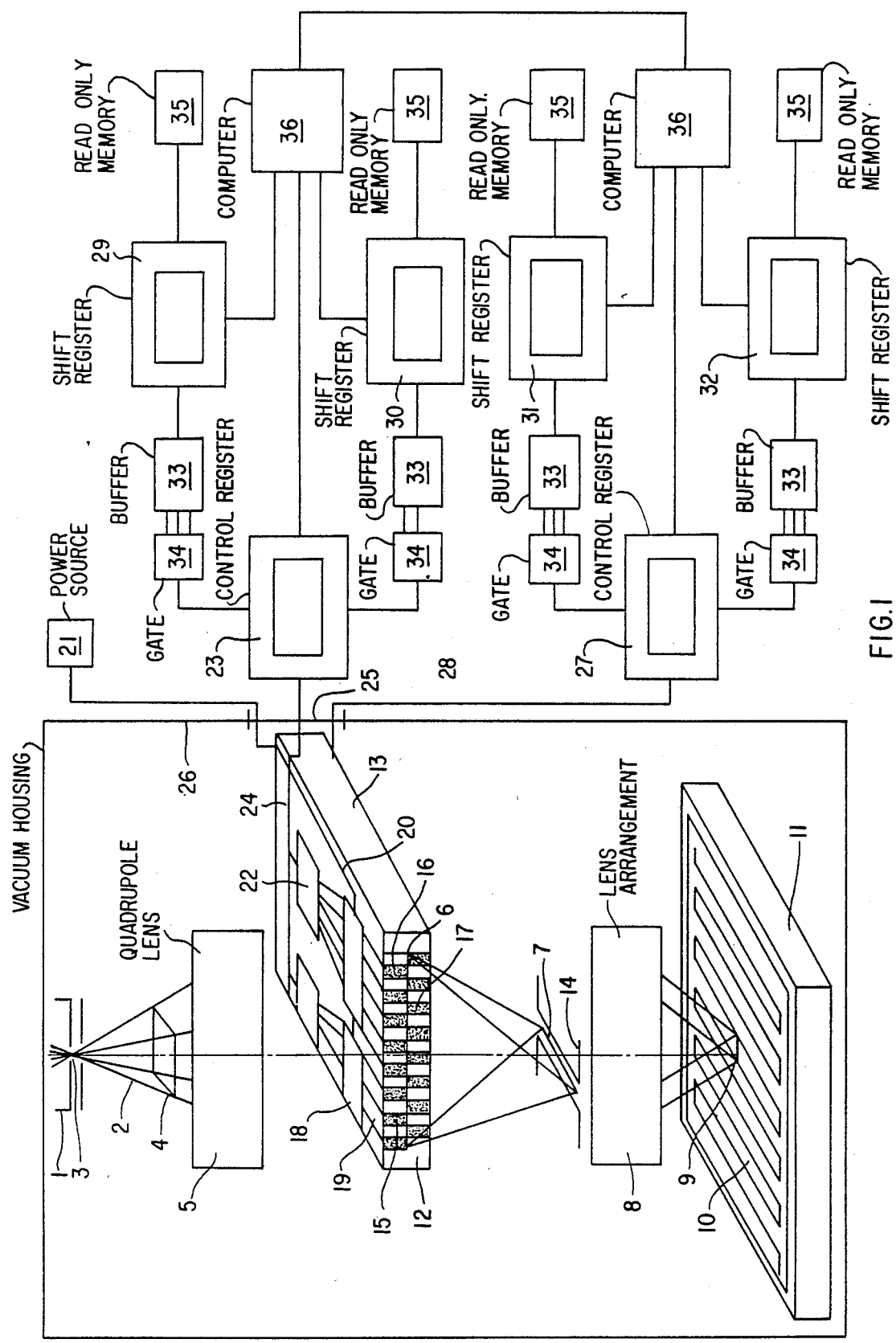

United States Patent [19]

Hahn

[11] Patent Number: 4,633,090
[45] Date of Patent: Dec. 30, 1986

[54] METHOD AND APPARATUS FOR PARTICLE IRRADIATION OF A TARGET

[75] Inventor: Eberhard Hahn, Jena, German Democratic Rep.

[73] Assignee: Jenoptik Jena GmbH, Jena, German Democratic Rep.

[21] Appl. No.: 615,971

[22] Filed: May 31, 1984

[30] Foreign Application Priority Data

Jul. 1, 1983 [DD] German Democratic Rep. .................................. 2526616

[51] Int. Cl.⁴ .................................. H01J 37/302
[52] U.S. Cl. .................................. 250/492.2; 250/398
[58] Field of Search ............... 250/396 R, 398, 492.2, 250/492.3, 492.23

[56] References Cited

U.S. PATENT DOCUMENTS

| 4,130,761 | 12/1978 | Matsuda | 250/492.2 |
| 4,153,843 | 5/1979 | Pease | 250/492.2 |
| 4,472,636 | 9/1984 | Hahn | 250/492.2 |

FOREIGN PATENT DOCUMENTS

| 158197 | 1/1983 | German Democratic Rep. . |
| 58-44717 | 3/1983 | Japan | 250/492.2 |
| 2116358 | 9/1983 | United Kingdom | 250/396 R |

*Primary Examiner*—Carolyn E. Fields
*Assistant Examiner*—Paul A. Guss
*Attorney, Agent, or Firm*—Jordan and Hamburg

[57] ABSTRACT

Method and apparatus for particle irradiation of a target, wherein the anisotropic contrast deflection of an irradiation modulator for producing the exposure pattern is produced step by step, the magnitude of the potential difference between the electrodes of a comb electrode is being set, and the structuring of a line probe is controlled by a control logic according to given specifications by utilization of potential setting patterns.

15 Claims, 21 Drawing Figures

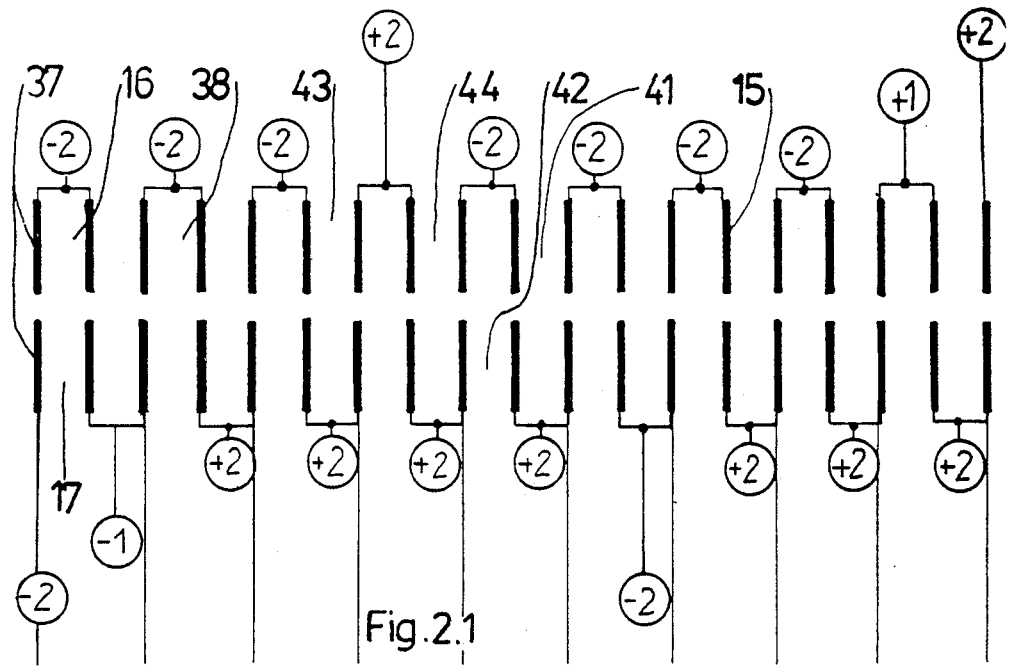
Fig. 2.1
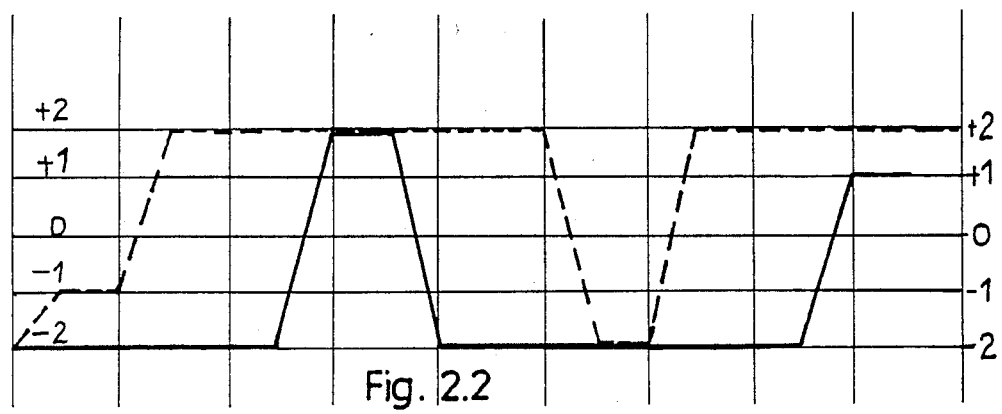
Fig. 2.2
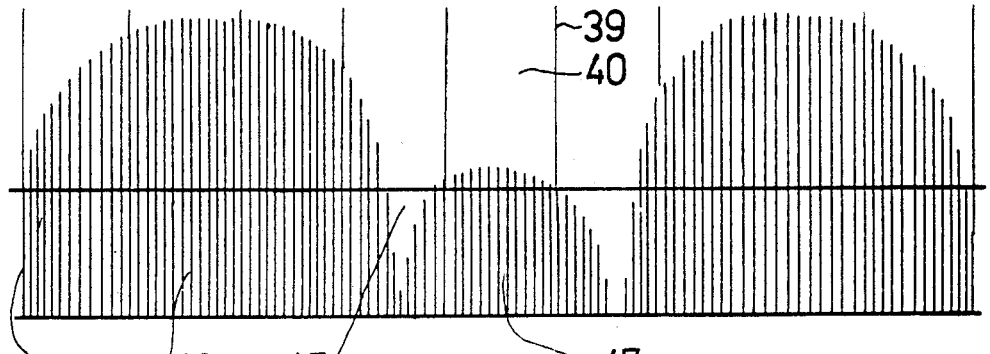
Fig. 2.3

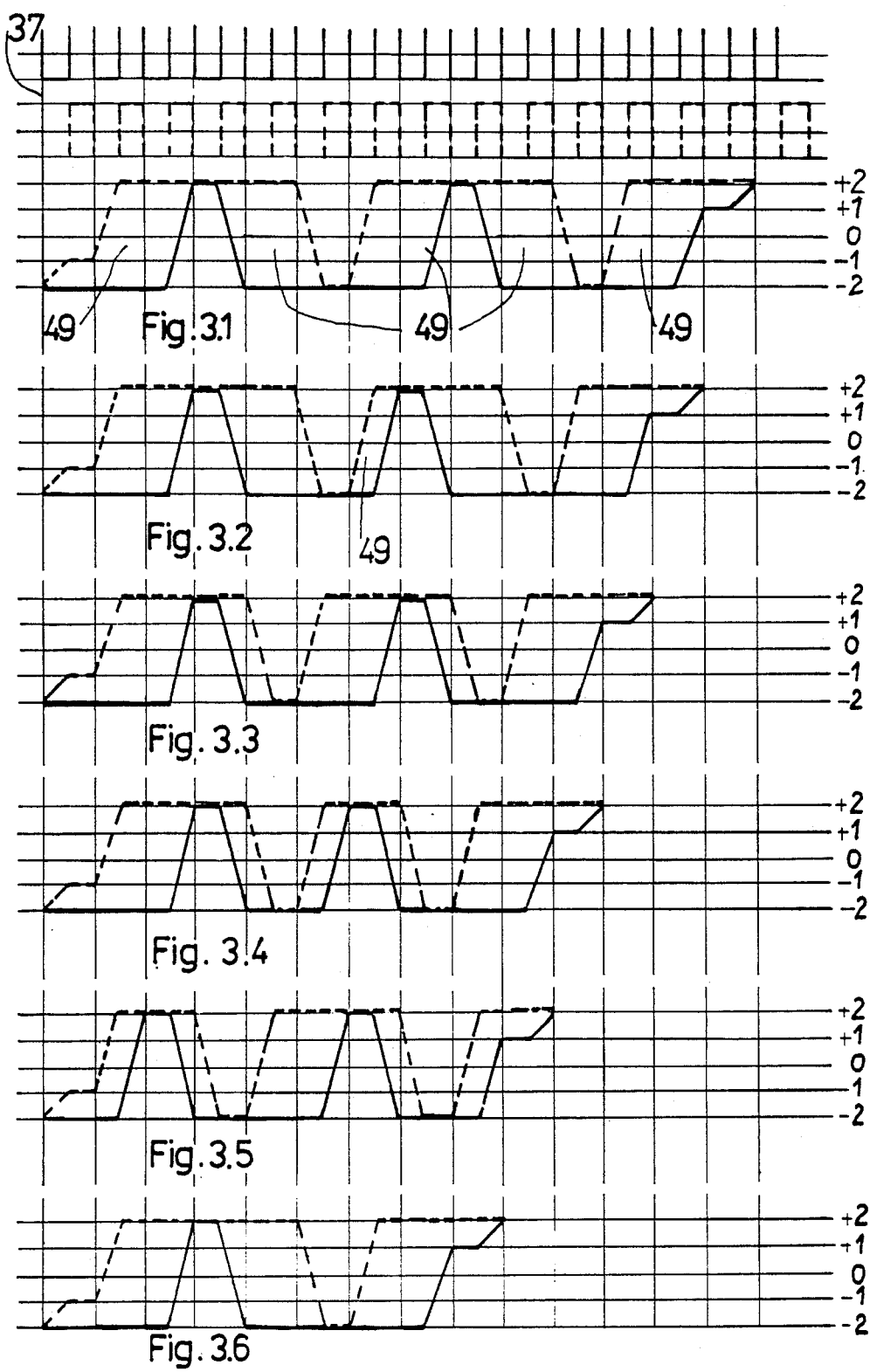

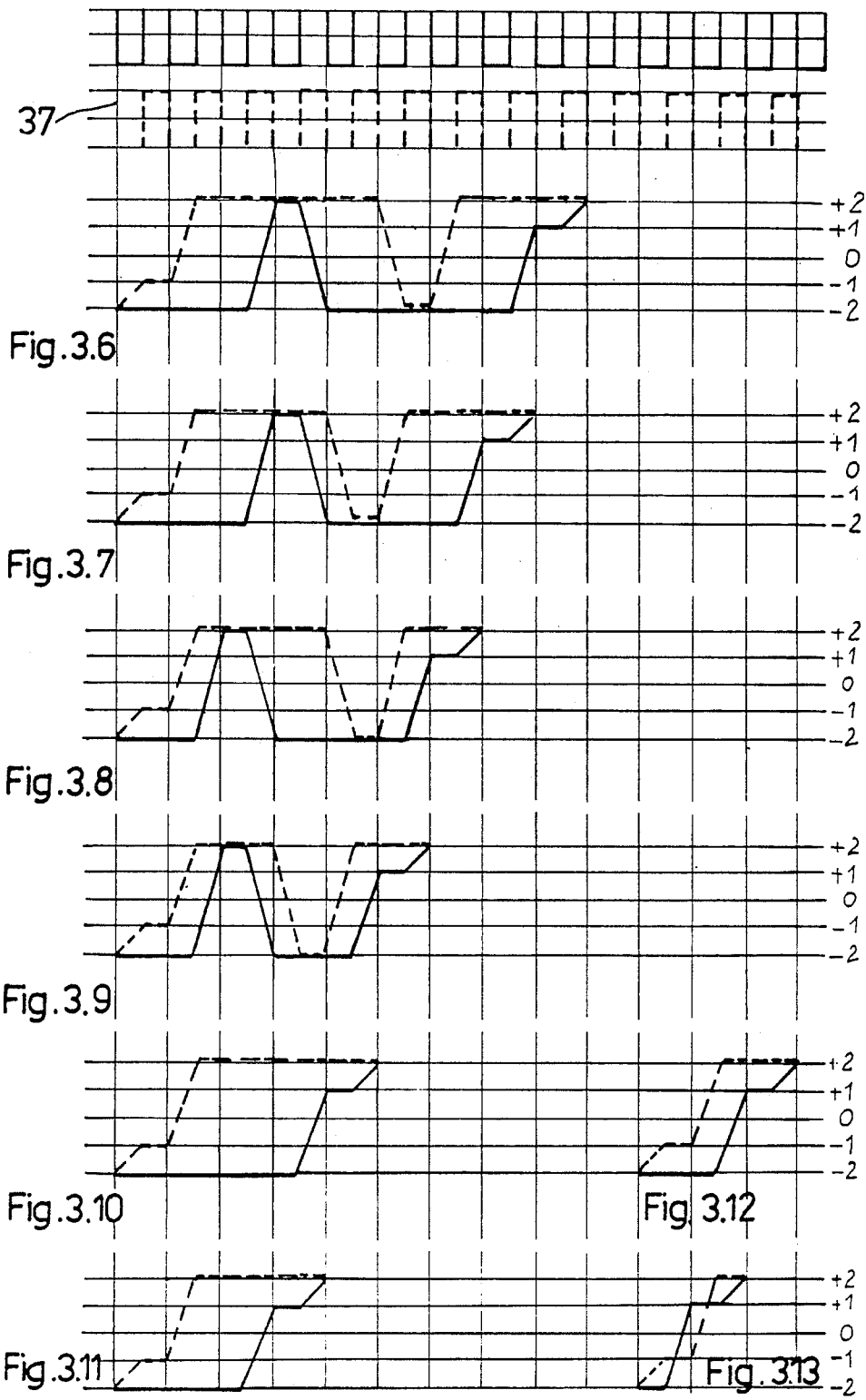

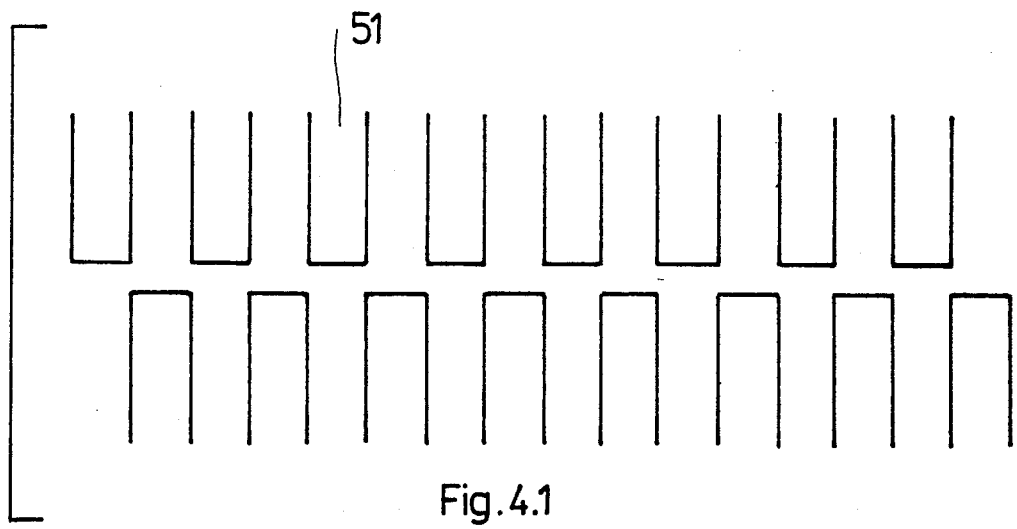
Fig. 4.1
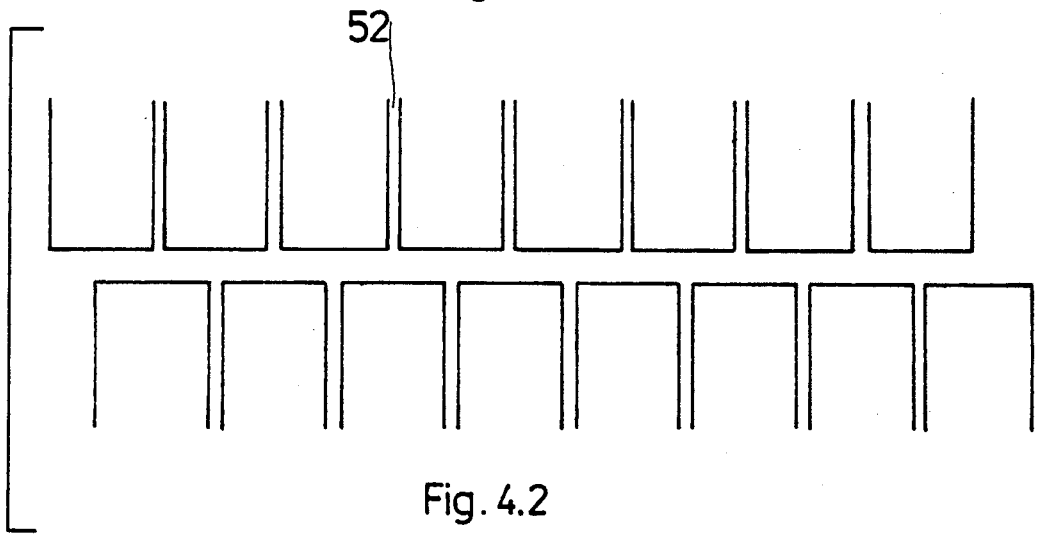
Fig. 4.2
Fig. 4.3

METHOD AND APPARATUS FOR PARTICLE IRRADIATION OF A TARGET

The invention relates to a method and an apparatus for particle irradiation, especially electron irradiation of a target, whereby an exposed pattern is produced on a layer mounted on a semiconductor plate. The invention can be used in particle irradiation apparatuses with electrically charged particles for treating a work piece, especially in electron irradiation apparatuses for microlithographic structuring of thin layers in the production of components of element measurements in the submicrometric range. In these particle irradiation apparatuses, especially the structural irradiation principle is applied, whereby a formed electron beam is used, whereby controlled structuring takes place in its formed cross-section.

Several methods and apparatuses are known, wherein particle irradiation produces local changes in thin layers, allowing microlithographic structuring of targets. In this regard, solutions are known, in which, by applying the structural irradiation principle, an irradiation modulator acts upon a preformed irradiation complex, which is advantageous with respect to productivity with high structuring precision.

U.S. Pat. Nos. 4,153,843 and 4,130,761 describe inventions, in which an irradiation bundle is controllably structured, whereby the irradiation bundle is diffracted into a multitude of partial bundles. Characteristic of this kind of diffraction is masking by means of a perforated masking device into a multitude of channels. Each channel contains a separate deflection system for illuminating/blanking of the partial bundle this arrangement is disadvantageous in that the distance of the adjacent holes is relative by large compared to the diameter of the holes, and thereby only a small part of the primary bundle current can pass through the perforated masking device and be available for further structuring. The cross-section of the multiple beams in the target plane is the demagnified projection of the perforated masking device. Controlled exposure of a random pattern is complicated, because one and the same structural detail is struck several times consecutively by various different partial beams.

The technical solution in patent DD-WP No. 158,197 describes the structuring of the intensity of a line probe, whereby an irradiation modulator acts upon an astigmatically preformed irradiation complex. A first focus is focused on the tip of a comb electrode, and a second focus on the opening of an aperture stop. The first focus is reproduced stigmatically on the target. The comb electrode comprises a multitude of comblike arranged bars, which are individually connected to a controllable binary potential. If two adjacent electrodes have unequal potentials, then they produce an electrical field in their vicinity. The portion of the irradiation complex which passes through this vicinity is deflected by the electrical field. Essentially, the beams which pass the first focus at that particular interval are the ones which mark through the respective bar gap. The contrast deflection sensitivity is anisotropic. The only control is the field intensity component in the direction of the tip, because it deflects the beams perpendicular to the opening of the slit. By having the bars of the comb electrode connected to the poles of a power source via an electronic circuit activated by the data output of an external control logic, over the field of each bar gap, at any given point an electronic channel and an electron-optical channel are controllably connected to each other. An interference with an adjacent electron-optical channel does not take place, if firstly, the first focus is very narrow, and if secondly, the expansion of the bar electrodes in the direction towards the tip is very small in comparison to the bar gaps. Because in practice, these prerequisites can only be approximated, disadvantages arise.

From the edges of the dark intervals, a proportionally greater exposure results, the greater the focus. The direction of the field intensity of two adjacent dark intervals goes in opposite directions, because a binary potential is being controlled. This leads to the result that two adjacent dark intervals are separated by a zone in which the control effective field intensity component is zero, or only so small, that no dark scanning results. In this way, the control effective field range of the comb electrode is limited in its expansion vertical to the tip. This has a negative effect upon working productivity and adjustable tolerance.

In patent DD-WP No. 158,197, an improved method and apparatus are described which allow controllable structuring and modulation in intensity of a preformed irradiation cross-section, constituting a continuous surface, and referred to as a line probe. The control effective field width of the irradiation modulator in perpendicular direction to the tip of the comb electrode should not be any smaller than the center-to-center distance of two consecutive intervals. The intensity of the image elements, into which the irradiation modulator breaks down the line probe, should be adjustable. In this way, the tolerances are reduced respective to the setting of the beam cross-section, relative to the irradiation modulator, and/or that the irradiation dosage can be modulated in each surface element of the pattern which is to be exposed in the target plane for the purpose of correcting the proximity effect. Through the improved execution of the irradiation modulator, the technical production expenses thereof are reduced, static charge-up due to stray electrons is avoided, and the demands for an optimal data preparation for the potential settings on the comb electrodes are better met.

The advantage of the invention resides in the fact that by utilizing the solution according to this invention, the structuring of thin layers into the submicrometric ranges is made possible, whereby at increased working speed, an increase in productivity at high structuring precision is obtained.

The object of the invention is to provide a method and an apparatus for the structuring of a line probe by means of an irradiation modulator, whereby its anisotropic contrast deflection sensitivity controllably selectively affects the image elements of the line probe, whereby the modulation of the intensity in the image elements of the line probe for the purpose of correcting the proximity effect is possible, giving a greater control effective field width in perpendicular direction to the line probe.

According to the invention, the solution to this problem consists in providing a method for particle irradiation of a target, especially for electron irradiation of a layer mounted on a semiconductor for the purpose of producing an exposure pattern on said layer by means of an electron beam bundle, originating from an electron irradiator, whereby its irradiation cross-section is formed into a line probe. The line probe is directed, at any given time, to a part of the target to be worked on, and has an intensity structured in horizontal direction of the line probe, so that it can be controlled. An irradiation of anisotropic contrast deflection sensitivity acts on the astigmatically shaped irradiation complex, consisting of a first focus focused on the comb electrode, and of a second focus focused on the aperture stop, so that the line probe is divided in its longitudinal direction into uninterrupted and countable image elements. These image elements can be controllably dark scanned (blanked) for the purpose of reproducing an exposure pattern. The intervals on a comb electrode are assigned to the blanked image elements and are activated by applying a potential setting, and the thereby effective field intensity of the irradiation bundle of any given interval is deflected over an opening of an aperture stop. The following steps are used in the method:

For the production of the exposure pattern, the deflection contrast is produced step by step, whereby in the first modulation stage, only those intervals are activated which are assigned to uneven numbered image elements, and in a second modulation stage, only those intervals which are assigned to even numbered image elements. The magnitude of the potential difference in each interval is adjusted in such a way, so that for the blanking of image elements longitudinal to a part of the line probe intended for blanking, a respectively lower number of intervals of image elements intended for blanking is activated, so that longitudinal to each consecutive range of intervals, in which image elements are blanked, there results a periodic series of activated and non-activated intervals. The structuring of the line probe is controlled according to the exposure pattern, whereby an external control logic binarily simulates a periodic series of activated and non-activated intervals according to the position and the length of the parts of the line probe intended for and preferably connects the electrodes of the comb electrode in parallel operation with defined potentials by way of electronic circuits.

It is preferable if in an interval assigned to an image element which borders a part of the line probe intended for dark scanning, a lower potential difference is produced than in the remaining activated intervals. Thereby the resolution of the edge in transition from an irradiated to a non-irradiated range of the line probe can be maintained. This has the further advantage, that because of the increase of the potential difference on the inside of a portion of the line probe intended for blanking, the control effective field width vertical to the tip of the comb electrode is equal to the grid constant of the comb electrode, and that in the zones where the field intensity component changes its sign, there results no overexposure.

For the purpose of increasing the working speed of the irradiation apparatus, it is advantageous, if for the production of the periodic series of activated and non-activated intervals, it is always started from the same initial state of an external control logic for the control process of structuring, and that the initial state preferably is derived from the greatest possible distance of the activated intervals, whereby all image elements are still blanked. In this connection, it is preferable for the potential setting in the first and the second modulating stages to be brought into a fixed correlation independent from the exposure pattern, whereby the activated intervals of the first and the second modulation stage of each dark exposure are for themselves brought into a relationship to each other. It is thus preferable that the potential setting of the first and of the second modulation stages are mirror-symmetrically inverse with respect to the center of each darking exposure.

Furthermore, it is advantageous for the anisotropic contrast deflection sensitivity of the beam modulator to be varied by setting the angle between the second focus and the longitudinal axis of the aperture, because in this way, it is possible to change the slope of the variation of intensity in transition from irradiated to non-irradiated ranges.

An advantageous variation with respect to the work cycle of activating the electronic circuits results, if for the controllable structuring of the line probe, according to the position and length of the portions of the line probe intended for blanking, potential setting patterns are produced and made available chronologically in parallel.

In order to carry out the above method, it is necessary to use an apparatus constructed in such a way, that each of the two modulation stages is assigned an individual comb electrode, and that for the adjustment of the magnitude of the potential difference on the electrodes of the comb electrode, diversified potentials, preferably four, are connected to the electronic circuits actuated by the external control logic.

It is advantageous in respect to production expenses and for facilitating adjustments of the irradiation modulator, for the two comb electrodes to be aligned in the direction of the optical axis directly one after the other and parallel to each other. Low cost in the irradiation-optical construction can also be achieved, if both comb electrodes are installed on the narrow side of a semiconductor plate.

Advantages in the setting for the adjustment of the angle between the second focus and the opening of the aperture are achieved, if in the irradiation modulator, between the first and the second focus, known means are provided for the production of electrical and/or magnetic fields of rotationally-symmetrical or quadrupole-symmetrical configuration.

In order to avoid electrostatic charging and its related undesired determinental deflection effect upon the comb electrodes, the electrodes of the comb electrode can advantageously be formed like a surface, such that they lie in a plane parallel to the first focus and parallel to the optical axis, preferably being so wide that, except for narrow grooves, by means of which adjacent electrodes of the comb electrode are insulated, almost the entire surface of the comb electrode facing the particle irradiation is electrically conductive.

It is further possible to install the comb electrode on the surface of a semiconductor plate parallel to the first focus. Thereby planar technology can be favorably employed for the production of the comb electrode and for portions of the control electronics, which can also be installed on the semiconductor plate. In this regard, it is useful if known means be provided for the bending of the axis of the astigmatically formed irradiation complex, and that several electrical deflection systems for the purpose of bending the axis of the astigmatically formed irradiation complex in the direction of the beam transmission are arranged in such a way, that their fields are constituted so that the axis of the emitting beam bundle is parallel to the axis of the converging beam bundle. Mounting portions of the control logic on the semiconductor plate has the advantage that it thereby reduces the length and number of necessary control lines.

The apparatus can be advantageously completed by providing known means for the prevention of contamination of the effective control surfaces of the comb electrode.

The external control logic preferably comprises registers for storing the periodic initial settings, universal shift registers for the formation of potential setting patterns, gates and buffers for the formation of the potential settings of the portions of the line probe intended for illumination scanning, as well as circuit registers for the control of the circuits which connect the electrodes of the comb electrode to the potential sources.

The invention is illustrated with the aid of the following figures, wherein:

FIG. 1: schematically shows the embodiment of the invention;

FIGS. 2.1 to 2.3: illustrate those parts of the method of the invention which refer to the extension of the control effective field range in vertical direction to the tip of the comb electrode;

FIGS. 3.1 to 3.13: illustrate the potential setting pattern of a double comb for the purpose of producing dark exposures, of which the longitude is controlled;

FIGS. 4.1 to 4.3: illustrate the embodiment of the electrodes of a comb electrode.

FIG. 1 illustrates an embodiment of the apparatus of the invention with an irradiator 1 for the purpose of emitting an electron beam bundle 2, which proceeds from a cross-over 3, and which is intersected by a rectangular irradiation limitation deflector 4. A quadrupole lens arrangement 5 astigmatically focuses the beam bundle into two orthogonal focuses having axes perpendicular to one another: into a first focus 6, and thereafter into the second focus 7 separated from focus 6 in the direction of the axis.

A lens arrangement 8 of rotational symmetrical and/or quadrupole symmetrical construction stigmatically reproduces the first focus 6 as line probe 9 on the target 10. The table 11, which supports the target, is adjustable horizontally in two directions perpendicular to one another, so that the line probe 9 can be made to overlap any point of target 10, the table 11 preferably being moved in a meandering way.

The beam modulator acts upon the irradiation bundle formed by the quadrupole lens configuration 5. The beam modulator consists of the electrode strip 12 mounted parallel to and at the height of the first focus 6 on a support plate 13, as well as an aperture deflector 14 mounted parallel to and at the height of the second focus 7. To the electrodes 15 of the electrode strip 12 are applied potentials, so that in the vicinity of the electrode strip 12 an electric field is active, of which the contrast deflection sensitivity is anisotropic, and which allows for a controllable structuring of the line probe 9.

The essential working method of an irradiation modulator is described in DD-WP No. 158,197. According to the invention, the requirements placed upon the irradiation modulator can only be met partially and insufficiently by the apparatus of the prior art.

Firstly, the control effective field width vertical to the electrode strip 12 should be greater than the focus width to allow higher productivity; the focus width agrees with the grid constant of the electrode raster. Thereby, secondly, the unsharpness of structuring, i.e. the longitude of the transitional interval from illumination to blanking, respectively from blanking to illumination, should be smaller than the grid constant of the electrode raster. Finally, thirdly, the necessary potential setting of the electrode strip 12, required for the individual exposure pattern, should be controllable at high speed by the primary data of the exposure pattern, i.e. by the ordinates from the beginning to the end of the blank exposure.

In order to fulfill the first requirement, according to the present invention, the beam modulator is divided into two modulation stages, whereby the electrode strip 12 is divided into a first comb electrode 16 and a second comb electrode 17 which lies in beam transmission direction behind, and is transposed by a half grid constant from the first comb electrode. This has the advantage, that instead of thin bar electrodes with relatively great bar gaps, there now are wide band electrodes with preferably small gaps, which are technologically superior. The decisive difference between a single comb with a binary controlled potential setting is, that in the range of the blank exposure, the zones of opposite directed contrast deflection are divided by intervals having a contrast deflection acting in the same direction; and that the lengths of the last mentioned intervals are adjustable without resulting in increased illumination.

To the electrodes 15 of the comb electrodes 16 and 17, in the working example embodiment, are applied the potentials $-2$, $-1$, $+1$ and $+2$. These potentials represent symbolically standardized and signed multiples of a base potential.

The zones with opposite contrast deflection originate in the environment of an electrode, which contrary to its adjacent electrodes of the same comb electrode 16 or 17, which are set for $-2$, is set to counter potential, i.e. $+2$. Within the limitations of a single comb, an alternating potential setting, i.e. $-2$, $+2$, $-2$, $+2$, $-2$, etc. is necessary in the range of the blank exposure. By utilizing a double comb 16 and 17 according to the invention, in the range of the blank exposure, the potential settings of the two comb electrodes 16 and 17 are mirror-symmetrically inverse, and when utilizing the maximum allowable lengths of the intervals with the same directional contrast deflection, which in the case of the first comb electrode 16 is the period $-2$, $-2$, $-2$, $-2$, $+2$, and in the case of the second comb electrode 17 of the period $-2$, $+2$, $+2$, $+2$, $+2$. The gain in control effective field width relative to a single comb, is a period increased by the factor of 2.5.

In order to fulfill the second requirement, to the particular electrode 15 of the first comb electrode 16, respectively to the second comb electrode 17, the blanking ends or begins, there is assigned an intersticial potential $-1$, respectively $+1$, whereby interference to the adjacent illumination range is avoided. The control of four potentials is not disadvantageous for the binary representation of the potential setting, because the interpolation of intersticial potentials is only performed on those blank exposure ends, which, as far as data is concerned, are already marked.

The electrode strip 12 is preferably disposed on the narrow side of the carrier plate 13 which is preferably a semiconductor plate. The controls 18 are installed on top of its breadth, according to microlithographic technique, of which each individual one is fixedly connected with an electrode 15 of the first comb electrode 16 via the supply line 19, and via which a potential of preferably four controllable potentials may optionally be connected, which are ready for use via the supply line 20 of a power source 21. The controls are controlled in parallel via the multiplexer 22 by the control register 23 of the first modulation stage, of which the setting corresponds to the potential setting of the first comb electrode 16; whereby each storage location of the control register 23 is circuit wise assigned an electrode 15 of the first comb electrode. Under the breadth of the carrier plate 13 are installed in analogous fashion controls, multiplexers and connection lines. Also via the supply lines 20, the potentials of the power source 21 are directed to the controls. The control lines 24 of the first modulation stage are numerically reduced by the multiplexer 22, and are provided with a vacuum sealed duct 25 through the vacuum housing 26, in which the irradiator 1, the irradiation limitation deflector 4, the quadrupole lens configuration 5, the lens configuration 8, the carrier plate 13 and the adjustable table 11 are enclosed. The control lines 24 lead to the parallel output of the control register 23 of the first modulation stage.

The output of the control register 27 of the second modulation stage is connected to the controls of the second comb electrode 17 by the control lines 28 via multiplexers. The setting of the control register 27 corresponds to the values of the potential of the second comb electrode 17.

The third requirement is fulfilled whereby the necessary setting for each individual exposure pattern in the control registers 23 and 27, which are explained in FIG. 2 and FIG. 3, derived from the result of a series of shifting pulses occurring in the universal shift registers 29, 30 and 31, 32, whereby its number t is independent of the line probe and limited to, for instance, t≦10. The two control registers 23 and 27 each have two parallel inputs, to which are connected the parallel outputs of the four universal shift registers 29 to 32. In each of the respective parallel lines, there are disposed a buffer 33 having 3 parallel outputs and a gate 34 for the purpose of light scanning of a remaining dark line remnant in the programmed area of a light line.

The parallel inputs of the universal shift registers 29 to 32 are connected to the parallel output of a particular read-only memory unit 35, in which an initial setting independent from the exposure pattern is stored, namely the blanking exposure setting of the period of −2, −2, −2, −2, +2; respectively −2, +2, +2, +2, +2.

The computer 36 controls in parallel operation in relationship to the data of the exposure pattern the analysis of the control registers 23 and 27 into subcontrol registers and during the shift pulse intervals, the universal shift registers 29 to 32 into subshift registers. It further controls the direction, shifting to the left and to the right, and the number of the shifting pulses.

FIGS. 2.1 and 2.2 serve to illustrate those portions of the method and apparatus of the invention which relate to an expansion of the controlling field range normal to the tip of the comb electrode.

FIG. 2.1 illustrates a double comb 37. The comb electrode of the first modulation stage is labeled 16 and the second is labeled 17. On the first comb electrode 16, two adjacent, line-shaped configured electrodes 15 are each alternately electrically short circuited, as on the second comb electrode 17, however, it is done in such a way, that the bridged bar gaps 38 of the first comb electrode 16 alternate with those on the second comb electrode 17. Only those intervals which are not bridged can be activated. The beam transmission direction is parallel to the bars in the intermediate plane, pointing from the comb electrode 16 in the direction of the comb electrode 17. Of the intervals lying consecutively behind each other in the beam transmission direction, one interval each of the first comb electrode 16, and one interval each of the comb electrode 17, are assigned together to an image element of the line probe 9, because the combined bar length of the two comb electrodes still lies within the resolution depth of the stigmatically reproducing optic. Of the two consecutively lying intervals, however, only one interval can be activated at any time, because the neighboring bars of the other are short circuited. By counting through the image elements of the line probe 9, the activatable intervals of a first modulation stage (16) correspond to the uneven numbered image elements, and the activatable intervals of a second modulation stage (17) correspond to the even numbered image elements. Because in each instance, two neighboring electrodes 15 of a comb electrode are alternately short circuited, the grid constant of the first comb electrode 16, as well as of the second comb electrode 17, is increased by a factor of two. It is adjusted to the grid constant of the structural raster in a 1:1 ratio.

Two neighboring intervals of the first modulation stage, of which one can be activated, and the other one cannot, and the two intervals of the second modulation stage which follow them consecutively in beam transmission direction, of which one cannot be activated and the other one can, define a channel. The line 39, going from top to bottom, drawn in the distance of the grid constant, symbolizes the division into channels. The entrance of a channel is the space on the first focus 6 marked by two neighboring intervals, and the exit leads into the image element pair on the line probe 9 assigned to that space. Between the entrance and the exit, there exists a stigmatic reproduction relationship with a resolution capacity of approximately half a channel width.

The electron current flowing in the channel is controlled by the contrast controlling field intensity applied at the entrance. According to the invention, this field intensity is not exclusively produced by the potential difference which exists between the electrodes marking the channel entrance of the first, and second, modulation stage. The two intervals 41 and 42 of the first comb electrode 16, and the second comb electrode 17, which mark the entrance of the channel 40, are not activated, as can be seen from the potential curve of FIG. 2.2. Regardless thereof, the image element pair located at the channel exit is blanked. This is made possible by the use of two modulation stages, because in the activatable intervals of the two neighboring channels, there are generated potential differences of equal signs, i.e. contrast controlling field intensities of equal direction. These encroach from both sides on the non-activated channel 40, where they add to each other, and blank the channel. This condition is supported by setting an increased potential difference.

In the intervals 43 and 44, the activated potential differences have different signs, and the contrast controlling field intensities are set in opposite directions. Thereby the contrast deflection is weakened in the transitional area from one interval to the other where the two field intensities subtract from each other, as is demonstrated in FIG. 2.3 with the illumination wedge 45, which separates the shaded areas 46 and 47 from each other. The illumination wedge 45 is not cancelled by the stigmatically reproducing optic, and leads only to an insignificant illumination of the respective channel image element pair, which is insufficient for an exposure through the layer of lacquer of the target 10, and which therefore is microlithographically harmless.

According to the invention, the light wedge 45 is narrowed by setting the opposite potential differences significantly higher than the potential difference on the border 48 of a dark line. On the border of a dark line, an interference of the last blank controlled channel to the following first channel of the illumination exposure is not permissible, because of the overlap precision of the channel raster with the structure raster. For the present reason, in this invention, the electrodes 15 of the double comb are controllably switched to a quarter potential, whereby the electrodes 15 of the double comb are connected to the poles of a quadruple polar voltage divider via the electronic circuits 18.

In comparison with the disclosure of patent DD-WP No. 158,197, a greater width of the contrast effective field range in perpendicular direction to the surface of the double thereby results, whereby it is possible to set the first focus 6 at a greater width and/or a greater distance to the tip of the comb electrode.

FIG. 2.2 illustrates that the potential setting of the second modulation stage, drawn in dashed lines is mirror-symmetrically inverse to the potential setting of the first modulation stage, drawn in full lines. A characteristic of the present invention is its mirror inverse potential setting of the comb electrodes, by which dark lines are produced in the structured raster.

The potential settings of a double comb 37 illustrated in FIGS. 3.1 to 3.13 serve for the production of all dark lines whereby the length, in units of the structural raster, is a whole number, and is greater than, or equal to two. They fulfill the requirements in respect to border resolution and field width of the contrast deflection and serve to convert compressed data of the illumination pattern into decoded data of the potential setting.

The required potential setting for each individual exposure pattern of the line probe 9 is contentwise copied in the control registers 23 and 27 of FIG. 1 and consists of a series of potential setting patterns corresponding to the position and the length of the dark lines of which the data is primarily preset. The formation of uniform potential setting patterns of each individual illumination pattern of the line probe 9 occurs in parallel operation within, for example, ten pulse steps.

To the lengths l of the dark exposure of an exposure pattern are assigned groups, where the index n indicates the number of the struts 49, which imagewise support the lower level against the upper. In FIGS. 3.1 to 3.5, $n=5$, and at the constant n, the controllable length of the dark exposure extends from $l=14$ to $l=10$. In FIGS. 3.6 to 3.9, $n=3$, and at the constant n, the controllable length of the dark exposure extends from $l=9$ to $l=6$. In FIGS. 3.10 to 3.13, $n=1$, and at the constant n, the controllable length of the darkening extends from $l=5$ to $l=2$.

The potential setting of the second modulation stage, represented as the curve with the dotted lines, is mirror-symmetrically inverse to the potential setting of the first modulation stage, represented as the curve drawn in full lines.

The potential setting sample of the dark exposures, of which the length is greater than $l=14$, is formed analogously from FIGS. 3.1 to 3.5. The maximal length which is represented in the group by the index n, $l_{max}$, has the length $l_{max} = -1 + 5[(n+1)/2]$, and $l_{max} - 1 \leq 4$ is the number of the strut 49, which is to be narrowed, and which is symmetrical to the middle of the potential setting pattern analogous from FIGS. 3.1 to 3.5.

The potential setting of a darkening exposure of the length $l_{max}$ is, with the exception of the potential gradation on each individual edge, contentwise identical to the initial setting of the simulated darkening controlled line probe 9, at which the potential setting is periodically continued according to the pattern $-2, -2, -2, -2, +2$, and $-2, +2, +2, +2, +2$. By pulsing the initial setting to the maximum of four raster units, for instance, to the right, the initial setting on the location of the potential setting pattern of each darkening exposure of a group, set at $l_{max}$, can be made to overlap according to the phase. For the adjustment of the length of the potential setting pattern to the given length of each individual darkening exposure, also there are necessary no more than four pulses, because inside of a group there are no more than four struts 49 which are to be narrowed.

FIGS. 4.1 to 4.3 show embodiments of the electrodes 15 of the comb electrodes.

The method according to the invention offers the advantage, that the requirement of the patent DD-WP No. 158,197, stating that the bars 50, represented in FIG. 2.1, have to be thin in comparison to their reciprocal distance, can be abandoned. Instead of thin bars, or narrow conducting paths, tape shaped electrodes 51 can be utilized.

In FIG. 4.1, the width of the tape shaped electrodes 51 is equal to the width of the bar gap 38 of the comb electrode, as illustrated in FIG. 2.1.

In FIG. 4.2, the spacing of the electrodes 52 is shown to be small in comparison to the width of the electrodes. This is desirable for avoiding interferences due to charging up of the substratum, which semi-insulates the electrodes against each other.

According to FIG. 4.3, the electrodes can extend in a mushroom shaped formation over the insulating substratum 53.

The supply lines 19 and 20, represented in FIG. 1, for the electrodes of a double comb, can be installed on both sides of the semiconductor plate which supports the double comb on its narrow side.

I claim:

1. In the method for particle irradiation of a target, for producing an exposure pattern on a layer on a semiconductor by an electron beam emanating from an electron irradiator, wherein the line probe of the irradiator is formed by the cross section of the electron beam and is directed on a part of the target to be processed, the intensity of the line probe in the longitudinal direction being controllably structured, a beam modulator of anisotropic contrast deflection sensitivity acts on the astigmatically formed beam complex, consisting of a first line foucs, adjusted to a comb electrode, and a second line focus, adjusted to a slit aperture, thereby dividing the line probe in its longitudinal direction into imge elements which are without gaps and which are countable, and which can be controllably blanked for the purpose of reproducing an exposure pattern, the intervals on a comb electrode assigned to the dark image elements being activated by applying a potential difference therebetween whereby the effective field intensity deflects the irradiation bundle away from the opening of a slit aperture; the improvement comprising producing the contrast deflection step by step for the reproduction of the exposure pattern, whereby only those intervals are activated in a first modulation stage which are assigned to uneven numbered image elements, and only those intervals are activated in a second modulation stage which are assigned to even numbered image elements, and setting the magnitude of the potential difference in each particular interval such that for blanking of the image elements longitudinal to a part of the line probe intended for blanking, fewer intervals are activated in comparison to the number of the image elements intended for blanking, so that a periodic series of activated and non-activated intervals results longitudinal to each continuous range of intervals of which the image elements are blanked; and controlling the structuring of the line probe according to the exposure pattern, whereby an external control logic binarily simulates a periodic series of activated and non-activated intervals according to the position and the length of the part of the line probe intended for blanking.

2. Method according to claim 1, comprising producing a smaller potential difference in an interval to which an image element is assigned, which borders in a part of the line probe, which is intended for blanking, than in the remaining activated intervals.

3. Method according to claim 1, comprising always inducing the production of the periodic series of activated and non-activated intervals from the same initial state of an external control logic for the control process of the structuring, and deriving the initial state from the greatest possible spacing of the activated intervals, whereby all image elements are still blanked.

4. Method according to claim 1, comprising bringing the potential setting of the first and the second modulation stages into a fixed correlation independent of the exposure pattern, whereby the activated intervals of the first and the second modulation stages of each dark exposure are brought into a relationship in which the potential setting of the first and the second modulation stages are mirror-symmetrically inverse with respect to the center of each blanked region.

5. Method according to claim 1, comprising, for the controllable structuring of the line probe according to the position and the length of the parts of the line probe which are intended for blanking, forming the potential setting samples timewise parallelly for putting them into readiness for activating the electronic circuits.

6. In an apparatus for the particle irradiation of a target having first and second modulation stages for modulating an electron beam; the improvement comprising a comb electrode for each of said modulation stages located at a first line focus of the electron beam, and, in order to set the magnitude of the potential difference on the electrodes of the comb electrode, means are provided connected to the electronic circuits and activated by an external control logic, for applying different potentials to the electrodes.

7. Apparatus according to claim 6, wherein the comb electrodes of each of the modulation stages are positioned in the direction of the optical axis immediately consecutively and parallel to each other.

8. Apparatus according to claim 6 wherein the comb electrodes of each of the modulation stages are positioned on the narrow side of a semiconductor plate.

9. Apparatus according to claim 6, wherein the electrodes of the comb electrode are in a planar array and lie in a plane parallel to said first line focus and perpendicular to the optical axis, and are so wide that, with the exception of the narrow grooves insulating neighboring electrodes of the comb electrode from each other, substantially the entire surface of the comb electrode facing the particle irradiation beam is electrically conductive.

10. Apparatus according to claim 6, wherein the comb electrode is installed on the surface of a semiconductor plate parallel to said first line focus.

11. Apparatus according to claim 6, comprising conventional means mounted for bending the axis of the astigmatically formed irradiation complex.

12. Apparatus according to claim 11, wherein several electron deflection systems are mounted for bending the axis of the astigmatically formed irradiation complex in the direction of the beam transmission, the fields of the deflection systems being configured such that the axis of the emitted beam is parallel to the axis of the converging beam bundle.

13. Apparatus according to claim 8, wherein portions of control logic for the apparatus are installed on the semiconductor plate.

14. Apparatus according to claim 6, wherein conventional means are provided for the prevention of contamination of the effective control surface of the comb electrode.

15. Apparatus according to claim 6, wherein the external control logic comprises registers connected to store the periodic initial setting, universal shift registers connected for the production of potential setting patterns, gates and buffers connected to produce the potential setting of the portion of the line probe intended for unblanking, as well as control registers connected to control circuits for applying potentials to the electrodes of the comb electrode.

* * * * *